United States Patent
Moeller et al.

(10) Patent No.: US 9,726,742 B2
(45) Date of Patent: Aug. 8, 2017

(54) SYSTEM AND METHOD FOR ITERATIVELY CALIBRATED RECONSTRUCTION KERNEL FOR ACCELERATED MAGNETIC RESONANCE IMAGING

(71) Applicants: Steen Moeller, Minneapolis, MN (US); Edward Auerbach, Minneapolis, MN (US); Kamil Ugurbil, Minneapolis, MN (US); Essa Yacoub, Hudson, WI (US)

(72) Inventors: Steen Moeller, Minneapolis, MN (US); Edward Auerbach, Minneapolis, MN (US); Kamil Ugurbil, Minneapolis, MN (US); Essa Yacoub, Hudson, WI (US)

(73) Assignee: Regents of the University of Minnesota, Minneapolis, MN (US)

( * ) Notice: Subject to any disclaimer, the term of this patent is extended or adjusted under 35 U.S.C. 154(b) by 683 days.

(21) Appl. No.: 14/171,310

(22) Filed: Feb. 3, 2014

(65) Prior Publication Data
US 2014/0218026 A1 Aug. 7, 2014

Related U.S. Application Data

(60) Provisional application No. 61/759,865, filed on Feb. 1, 2013.

(51) Int. Cl.
| G01V 3/00 | (2006.01) |
| G01R 33/561 | (2006.01) |
| G01R 33/483 | (2006.01) |
| G01R 33/563 | (2006.01) |

(52) U.S. Cl.
CPC ....... *G01R 33/561* (2013.01); *G01R 33/4835* (2013.01); *G01R 33/56341* (2013.01)

(58) Field of Classification Search
CPC .............. G01R 33/561; G01R 33/4835; G01R 33/56341
USPC ......................................................... 324/309
See application file for complete search history.

(56) References Cited

U.S. PATENT DOCUMENTS

2014/0111201 A1* 4/2014 Kim ..................... G01R 33/543
324/309

OTHER PUBLICATIONS

Andersson, et al., A Comprehensive Gaussian Process Framework for Correcting Distortions and Movements in Diffusion Images, Proc. Intl. Soc. Mag. Reson. Med., 2012, 20:2426.

(Continued)

*Primary Examiner* — Susan Lee
(74) *Attorney, Agent, or Firm* — Quarles & Brady LLP

(57) ABSTRACT

A method for iteratively calibrating a reconstruction kernel for use in accelerated magnetic resonance imaging (MRI) is provided. An MRI system is used to acquire k-space data from multiple slice locations following the application of a multiband radio frequency (RF) excitation pulse. An initial reconstruction kernel is generated from the acquired k-space data, and this initial reconstruction kernel is used to produce an initial image for each of the multiple slice locations by applying the initial reconstruction kernel to the acquired k-space data. The average phase of each slice location is then calculated from these images, and used to shift the phase values of the subsequently acquired k-space data. From the phase-shifted k-space data, an updated reconstruction kernel is then generated. This process is repeated iteratively until a stopping criterion is satisfied.

11 Claims, 3 Drawing Sheets

(56) References Cited

OTHER PUBLICATIONS

Behrens, et al., Characterization and Propagation of Uncertainty in Diffusion-Weighted MR Imaging, Magnetic Resonance in Medicine, 2003, 50:1077-1088.
Blaimer, et al., 2D-GRAPPA-Operator for Faster 3D Parallel MRI, Magnetic Resonance in Medicine, 2006, 56 (6):1359-1364.
Blaimer, et al., Accelerated Volumetric MRI with a SENSE/GRAPPA Combination, Journal of Magnetic Resonance Imaging, 2006, 24(2):444-450.
Ge, et al., Myocardial Perfusion MRI with Sliding-Window Conjugate-Gradient HYPR, Magnetic Resonance in Medicine, 2009, 62:835-839.
Moeller, et al., FMRI With 16 Fold Reduction Using Multibanded Multislice Sampling, Proc. Intl. Soc. Mag. Reson. Med., 2008, 16:2366.
Moeller, et al., Multiband Multislice GE-EPI at 7 Tesla, With 16-Fold Acceleration Using Partial Parallel Imaging With Application to High Spatial and Temporal Whole-Brain FMRI, Magnetic Resonance in Medicine, 2010, 63 (5):1144-1153.
Setsompop, et al., Improving Diffusion MRI Using Simultaneous Multi-Slice Echo Planar Imaging, NeuroImage, 2012, 63(1):569-580.
Setsompop, et al., Blipped-Controlled Aliasing in Parallel Imaging (blipped-CAIPI) for Simultaneous Multi-Slice EPI with Reduced g-factor Penalty, Magnetic Resonance in Medicine, 2012, 67(5):1210-1224.

\* cited by examiner

SYSTEM AND METHOD FOR ITERATIVELY CALIBRATED RECONSTRUCTION KERNEL FOR ACCELERATED MAGNETIC RESONANCE IMAGING

CROSS-REFERENCE TO RELATED APPLICATIONS

This application claims the benefit of U.S. Provisional Patent Application Ser. No. 61/759,865, filed on Feb. 1, 2013.

STATEMENT REGARDING FEDERALLY SPONSORED RESEARCH

This invention was made with government support under RR008079, MH091657, and NS057091 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for reconstructing images from k-space data acquired using accelerated MRI techniques, such as simultaneous multi-slice acquisitions using multiband radio frequency ("RF") excitation and undersampled phase encoding.

In MRI it is common to acquire data with phase-encoding (in-plane) undersampling in order to reduce the acquisition times. The use of multiple channel receiver coils, which have unique sensitivities in space, along with specialized image reconstruction algorithms (SENSE and GRAPPA) that can fill in the missing data, make this data undersampling and subsequent "speed up" factor in MRI possible. Another way to accelerate image acquisition in MRI is to use multiband (MB) acquisitions, where, instead of undersampling signals to speed up, multiple signals are excited and refocused simultaneously. This can be considered as a slice (through plane) acceleration of MRI data acquisition as multiple images (slices) are acquired at the same time. In order to disambiguate the MRI signals from the different slices, as with undersampling, multiple channel receiver coils with unique sensitivities in space, along with specialized image reconstruction techniques are needed. Undersampling-based acceleration and simultaneous multi-slice acquisition-based acceleration can be used in conjunction to reduce the time it takes to generate a single image and the time it takes to acquire multiple images.

Different techniques have been proposed on how to disentangle the signals that are acquired at the same time from multiple slice locations. The original proposal was a SENSE-based algorithm. SENSE algorithms are known to be mathematically accurate, but challenging and unstable to implement due to a requirement for accurate sensitivity profiles. To circumvent this limitation, the use of data-driven data-interpolation schemes has been developed. For instance, in CAIPIRINHA a GRAPPA-type interpolation algorithm was used to separate the simultaneously acquired signals.

A similar data-driven approach was exploited and extended for fMRI by S. Moeller, et al., in "fMRI with 16 Fold Reduction Using Multibanded Multislice Sampling," *Proc. of the ISMRM*, 2008; page 2366. The principle is that an initial GRAPPA algorithm is deployed that separates the simultaneous signals (images) from the phase-encoding undersampled data, resulting in images (slice) with only undersampling (missing data). To separate out the signals, the reconstructed signals are treated as originating from an extended field of view (FOV), and the use of fast Fourier transforms (FFT) are required. A slice-unaliasing algorithm based on a conventional GRAPPA algorithm was introduced by S. Moeller, et al., in "Multiband multislice GE-EPI at 7 Tesla, with 16-fold acceleration using partial parallel imaging with application to high spatial and temporal whole-brain fMRI," *Magn Reson Med*, 2010; 63(5):1144-1153. The GRAPPA kernel was calculated from an artificially imposed extended FOV.

In Setsompop et al it was shown that this approach was not compatible with the blipped gradient train pattern, and a different coil-by-coil data driven technique was proposed. A slice-GRAPPA algorithm that performed sensitivity calibration and signal separation directly in the measured (acquired) space, thereby alleviating the need for FFTs, was introduced by K. Setsompop, et al., in "Blipped-controlled aliasing in parallel imaging for simultaneous multislice echo planar imaging with reduced g-factor penalty," *Magn Reson Med*, 2012; 67(5):1210-1224. This method also has the additional benefit that it is compatible with the relative shift between slices that are introduced with the Blipped-CAIPIRINHA method.

For both the slice-GRAPPA method and the method described by S. Moeller, et al., the use of both slice-aliasing (simultaneous acquisitions) and phase-encoding undersampling is corrected by the sequential application of either GRAPPA, and then a slice-separation algorithm, or in the reverse order (i.e. first a slice-separation and then a correction with GRAPPA). These approaches work well for data with high signal to noise ratios (SNR), and have been thoroughly tested for both functional MRI and diffusion data. However, for low SNR data, which is common in diffusion MRI, high spatial resolution MRI, and also in other quantitative and dynamic imaging techniques in MRI, these algorithms are not sufficient.

Regardless of whether the slice-GRAPPA method or the method described by S. Moeller, et al., is used, the relative phase difference between aliased slices is used in the reconstruction, since both magnitude and phase of individual coil sensitivities are used for unaliasing. The relative phase difference, however, can change during successive acquisitions. For instance, in an fMRI time series, or in subsequent acquisitions of multiple diffusion directions, the changing relative phase differences result in temporal fluctuations in signal intensity, which increases the variability in fMRI and in the detection of neuronal fibers in diffusion imaging.

It would therefore be desirable to provide a method for multiband calibration in simultaneous multi-slice imaging techniques that properly accounts for the relative phase between multiband slices.

SUMMARY OF THE INVENTION

The present invention overcomes the aforementioned drawbacks by providing a method for reconstructing an image using a magnetic resonance imaging (MRI) system that makes use of an iteratively calibrated reconstruction kernel. The MRI system is used to acquire k-space data from multiple slice locations following the application of a multiband radio frequency (RF) excitation pulse. An initial reconstruction kernel is generated from the acquired k-space data. An initial image is produced for each of the multiple slice locations by applying the initial reconstruction kernel to the acquired k-space data. An average phase value for each slice location is calculated from the respective initial image. A corrective phase shift is applied to the image of each slice location used for slice calibration. Subsequently, modified k-space data are generated using these calculated average phase values. An updated reconstruction kernel is then generated from the phase-shifted k-space data. An image for each slice location is then produced by applying the updated reconstruction kernel to the acquired k-space data.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
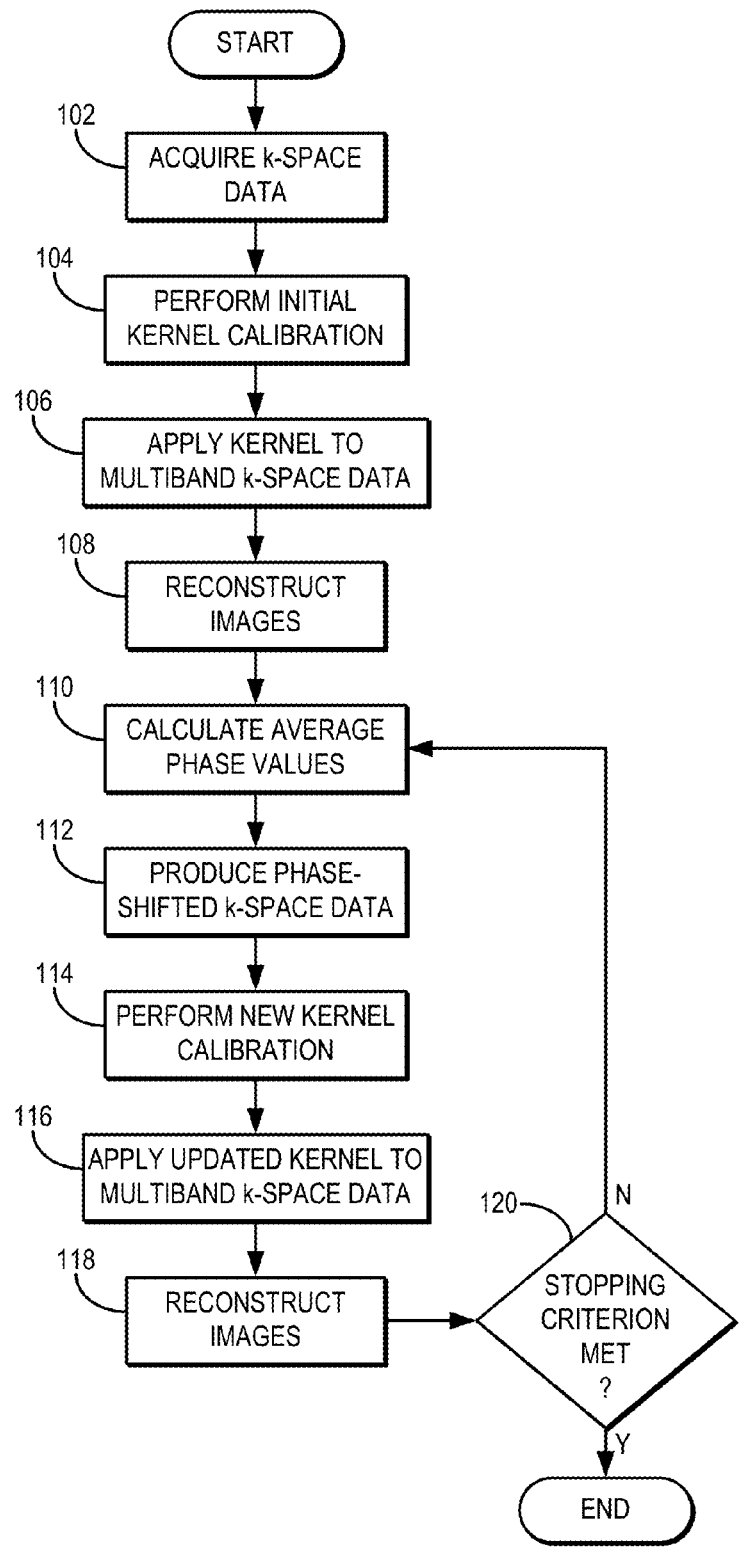
FIG. 1 is a flowchart setting forth the steps of an example of a method for iteratively calibrating a reconstruction kernel for use in accelerated MRI.

Described here are systems and methods for calibrating a reconstruction kernel used in accelerated magnetic resonance imaging ("MRI"). Using the systems and methods described here, images can be reconstructed from k-space data acquired using a multiband excitation with undersampling along the phase-encoding direction within each of multiple, simultaneously excited imaging slices. This method allows for accurate separation of simultaneously acquired slices. The relative phase of the multiband slices can be estimated from a sensitivity-weighted reconstruction of unaliased multislice data. As one example, this method can be beneficial for diffusion-weighted imaging applications, where using the correct phase results in a reduction in uncertainties of estimated fiber orientations. The method is also beneficial when using higher accelerations, including the combination of in-plane and slice accelerations, which increases sensitivity to motion and the subsequent variability on the relative phase difference.

The kernel calibration may be implemented as a series of linear matrix multiplications by projecting the acquired, aliased signals, $MB_{data}$, onto distinct signals, $slc_m$, related to unique slices or images in a coil-by-coil process. The projection matrices, $MB_m$, are used such that $$slc_m = MB_m \cdot MB_{data} \quad (1);$$

for each slice, m=1, . . . , M, and each coil channel. The projection matrices are built such that from each R×R×$n_{ch}$ subset of the measured, aliased data, $MB_{data}$, a single, unaliased k-space point is obtained for each channel, thereby forming a 1×$n_{ch}$ data vector. The minimum value of R depends on the number of slices that are aliased by way of their simultaneous acquisition.

Each projection matrix, $MB_m$, has dimension $n_{ch} \times (R \times R \times n_{ch})$. To calculate the projection matrices, a single-band (i.e., non-simultaneous) acquisition is required. A phase-shift is added to each slice, in which the phase that is used is identical to the phase that would be added with the phase-blipping for the multiband acquisition. All R×R blocks are extracted from the k-space of individual channels and from the simultaneous slices that are to be acquired with a multiband experiment. A linear system is then setup such that $$t = K \cdot s \quad (2);$$

where t is a set of target k-space points, s is a set of source k-space points in the acquired undersampled k-space data, and K is the reconstruction kernel to be determined, and from which the unknown matrices representing the projection operators can be determined. The approach for estimating the initial kernel is similar to the calibration step employed for kernel estimation in conventional GRAPPA. However, other kernel calibrations can also be implemented, such as the method proposed by K. Setsompop, et al., in the reference cited above. For fully sampled data, this linear system can be used to recover the individual single band signals, and for undersampled data, it can be used to recover the undersampled single band signals.

In some instance, different kernels are defined to reconstruct distinct, interleaved patterns in the measurement space. In these instances, a linear system is setup such that $$t_1 = K_1 \cdot s \quad (3);$$

and a second linear system is setup such that $$t_2 = K_2 \cdot s \quad (4).$$

Each linear system has dimensions $$n_{ch} \times n_p \quad (5);$$

where all the target points, $t_1$ and $t_2$, and the source points, s, are known, but the kernels, $K_1$ and $K_2$, are not known.

For each channel, the relative ratio in both phase and magnitude between the sum of the single-band slices are used for separation and interpolation of the signal. Changes in the relative phase, such as changes resulting from $B_0$ and calibration errors, have the consequence that the sum of the single-band signals is no longer equal to the true acquired multiband data. Thus, this discrepancy between the data used for calibration and the unaliased data will create residual signal. The phase correction method described below is applicable to slice separation both with and without undersampling.

Referring now to FIG. 1, a flowchart setting forth the steps of an example of a method for calibrating a reconstruction kernel in accordance with the present invention is illustrated. The process begins with acquiring k-space data from which images are to be reconstructed, as indicated at step 102. This acquisition preferably includes a first data acquisition and a second data acquisition. For instance, the first data acquisition is a non-accelerated acquisition used to acquire first k-space data that is fully sampled, and the second acquisition is an accelerated acquisition used to acquire second k-space data that is undersampled. As an example, the first acquisition includes sequentially exciting spins in each of a plurality of different slice locations using a single band radio frequency ("RF") pulse.

In some embodiments, the second acquisition includes a simultaneous multislice acquisition in which data is acquired simultaneously from the multiple slice locations following the application of a multiband radio frequency ("RF") excitation that excites spins in multiple different slice locations. Additionally, the second acquisition can utilize in-plane acceleration techniques, such as skipping k-space lines alone the phase-encoding direction such that k-space is undersampled along that direction.

The method proceeds with an initial kernel calibration, whereby an initial reconstruction kernel, K, is determined, as indicated at step 104. As an example, the initial kernel is determined from the first k-space data that is acquired without acceleration, and may be carried out as described above with respect to Eqn. (2). After the initial kernel is determined, it is applied to the second k-space data that is multiband data, $MB_{data}$, to produce unaliased data, as indicated at step 106. Initial images are then reconstructed from this unaliased data, as indicated at step 108. These initial images are then used to update the initial reconstruction kernel.

An average phase value over each channel is calculated for each slice from the initial images, as indicated at step 110. This average phase value is used to apply a phase shift to the first k-space data, as indicated at step 112. This phase shift can be performed either in the image domain or in k-space by applying the average phase values to the appropriate images or k-space data. Preferably, the phase correction is applied in the image domain by multiplying the initial images reconstructed in step 108 by the appropriate average phase values calculated in step 110 and computing the Fourier transform of the resultant phase-shifted images. As a result of this phase update, changes in spatial patterns between the calibration step and the actual data, which are likely due to physiological motion of the subject, are accounted for.

In some other embodiments, a phase value other than the average phase can be calculated at step 110 and used to update the first k-space in step 112. For instance, a spatially varying phase value can be computed and used for the phase update. When using a spatially varying phase value for the phase update it is preferable to have an accurate estimation of the phase. In some other embodiments, it is also possible to update the first k-space data using a magnitude value, such as an average magnitude value or a spatially varying magnitude value.

From the phase-shifted single-band data, an updated kernel is calculated, as indicated at step 114. The updated kernel is then applied to the acquired multiband data, as indicated at step 116, to produce unaliased k-space data that has been corrected for phase shifts. Using the updated kernel and the acquired k-space data, images are reconstructed, as indicated at step 118. These images are then compared to the initial images to assess whether the new reconstructed signal is similar enough to the original signal, at which time the method is stopped at decision block 120; otherwise, steps 110-118 are repeated and the stopping criterion is assessed by comparing images reconstructed in the current iteration to the images reconstructed in the previous iteration. The loop continues until convergence is obtained. An example of a satisfied stopping criterion includes where the change in signal between the current and previous iteration is less than a predefined ratio, such as one percent.

Figure 2:
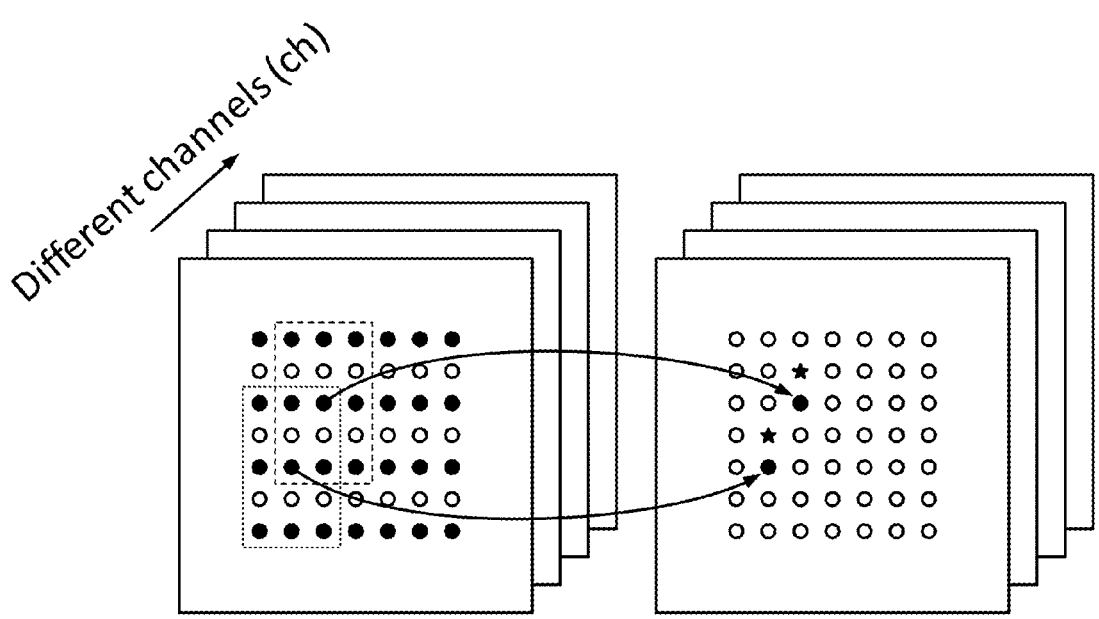
FIG. 2 is an illustrative example showing different portions of k-space being identified, for which different reconstruction kernels can be generated.

As noted above, in some instances, a reconstruction kernel can be generated for a particular portion of k-space and multiple such reconstruction kernels can then be used when reconstructing the respective portions of k-space. Referring to FIG. 2, an illustrative example is provided. First, the k-space points that have a matching source are extracted and stored as target points, $t_1$, in a first portion of k-space. Those points that have a set of matching sources, but are not spatially aligned with those sources, are stored as target points, $t_2$, (indicated by the black stars) in a second portion of k-space. These target point sets are then used together with Eqns. (3) and (4) when generating reconstruction kernels, $K_1$ and $K_2$, associated with the respective portions of k-space.

Figure 3:
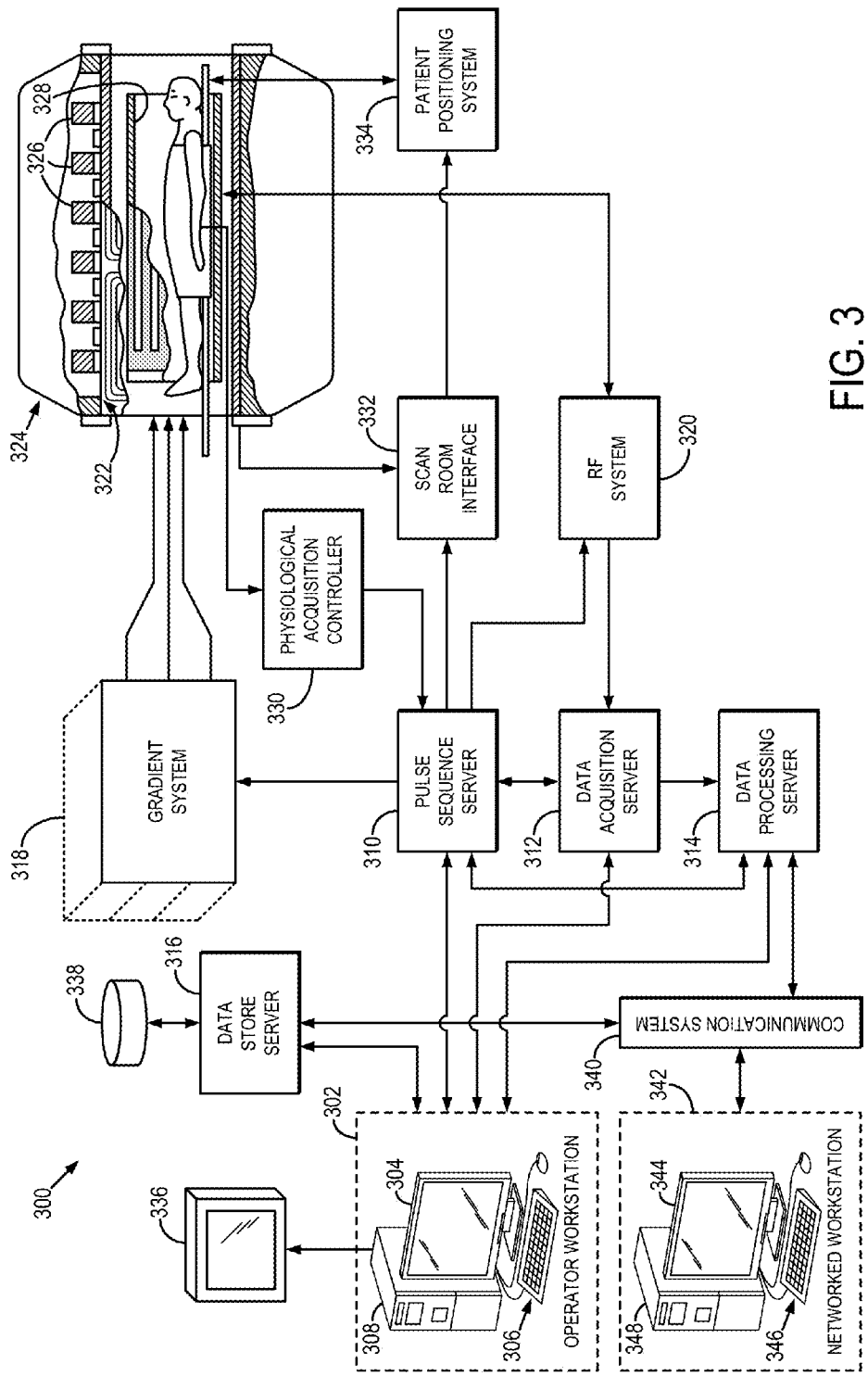
FIG. 3 is a block diagram of an example of an MRI system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (6);$$

and the phase of the received magnetic resonance signal may also be determined according to the following relationship:

$$\varphi = \tan^{-1}\left(\frac{Q}{I}\right). \quad (7)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image using a magnetic resonance imaging (MRI) system, the steps of the method comprising:
 a) acquiring, using the MRI system, first k-space data from a plurality of different slice locations, wherein spins in each slice location are excited using a single band radio frequency (RF) excitation pulse;
 b) acquiring, using the MRI system, second k-space data from the plurality of different slice locations, wherein spins in the plurality of different slice locations are excited using a multiband RF excitation pulse;
 c) generating an initial reconstruction kernel from the first k-space data acquired in step a);
 d) producing an initial image for each of the multiple slice locations by applying the initial reconstruction kernel generated in step c) to the second k-space data acquired in step b);
 e) producing an updated reconstruction kernel by deriving one of phase information and magnitude information from the initial images produced in step d), generating updated k-space data by applying the derived one of phase information and magnitude information to the first k-space data, and generating the updated reconstruction kernel from the updated k-space data; and
 f) producing an image for each slice location by applying the updated reconstruction kernel to the second k-space data acquired in step b).

2. The method as recited in claim 1, wherein step e) includes deriving phase information from the initial images and applying the phase information to the first k-space data to produce phase-shifted k-space data.

3. The method as recited in claim 2, wherein the phase information includes an average phase value calculated for each slice location from the respective initial image for that slice location.

4. The method as recited in claim 3, wherein calculating the average phase value includes averaging phase values over each channel in a multichannel receiver.

5. The method as recited in claim 4, wherein calculating the average phase value includes averaging over each spatial frequency in addition to over each channel in the multichannel receiver.

6. The method as recited in claim 2, wherein the phase information includes a spatially varying phase value calculated from the initial images.

7. The method as recited in claim 2, wherein the phase-shifted k-space data is produced by producing phase-shifted images by multiplying the initial images produced in step d) by the phase information, and Fourier transforming the phase-shifted images into k-space.

8. The method as recited in claim 1, wherein the second k-space data acquired in step b) is undersampled along a phase-encoding direction.

9. The method as recited in claim 1, wherein steps d) and e) are repeated to iteratively update the reconstruction kernel until a stopping criterion is satisfied.

10. The method as recited in claim 1, wherein the initial reconstruction kernel generated in step c) includes a first initial reconstruction kernel and a second initial reconstruction kernel, the first initial reconstruction kernel being associated with a first portion of k-space and the second initial reconstruction kernel being associated with a second portion of k-space that is different that the first portion of k-space.

11. The method as recited in claim 10, wherein the first portion of k-space is associated points in k-space where a source point is matched and spatially aligned with a target point, and the second portion of k-space is associated with points in k-space where a source point is matched but not spatially aligned with a target point.

* * * * *